US010504429B2

(12) United States Patent
Park et al.

(10) Patent No.: US 10,504,429 B2
(45) Date of Patent: Dec. 10, 2019

(54) ELECTROLUMINESCENT DISPLAY AND METHOD OF DRIVING THE SAME

(71) Applicant: LG Display Co., Ltd., Seoul (KR)

(72) Inventors: Eunji Park, Wonju-si (KR); Bumsik Kim, Suwon-si (KR); Sungman Han, Paju-si (KR); Kihyung Lee, Yong-si (KR)

(73) Assignee: LG Display Co., Ltd., Seoul (KR)

( * ) Notice: Subject to any disclaimer, the term of this patent is extended or adjusted under 35 U.S.C. 154(b) by 150 days.

(21) Appl. No.: 15/823,383

(22) Filed: Nov. 27, 2017

(65) Prior Publication Data

US 2018/0182287 A1 Jun. 28, 2018

(30) Foreign Application Priority Data

Dec. 22, 2016 (KR) ........................ 10-2016-0176663

(51) Int. Cl.
*G09G 3/3233* (2016.01)
*H01L 51/52* (2006.01)
*G09G 3/3258* (2016.01)

(52) U.S. Cl.
CPC ....... *G09G 3/3233* (2013.01); *H01L 51/5206* (2013.01); *G09G 3/3258* (2013.01); *G09G 2310/0264* (2013.01)

(58) Field of Classification Search
CPC ......... G09G 3/3233; G09G 2310/0264; G09G 3/3258; G09G 2320/045; G09G 2320/0233; G09G 2310/0262; G09G 2310/0251; G09G 2300/0861; G09G 2300/0842;

(Continued)

(56) References Cited

U.S. PATENT DOCUMENTS 9,858,863 B2 * 1/2018 Kim ..................... G09G 3/3233
2007/0057873 A1 * 3/2007 Uchino ................ G09G 3/3233
345/76

(Continued)

FOREIGN PATENT DOCUMENTS

EP 2996108 A2 3/2016

OTHER PUBLICATIONS

Extended European Search Report, European Patent Office Patent Application No. 17204635.1, dated Apr. 24, 2018, 11 pages.

*Primary Examiner* — Amr A Awad
*Assistant Examiner* — Maheen I Javed
(74) *Attorney, Agent, or Firm* — Fenwick & West LLP

(57) ABSTRACT

An electroluminescent display and a method of driving the same are disclosed. The electroluminescent display includes a driving transistor configured to generate a driving current depending on a gate-source voltage, a storage capacitor configured to store a data voltage and provide the stored data voltage to a gate electrode of the driving transistor, a first switching transistor configured to control a gate potential of the driving transistor, a second switching transistor configured to control a source potential of the driving transistor, a light emitting diode configured to emit light in response to the driving current generated from the driving transistor, and a third switching transistor configured to electrically float a source electrode of the driving transistor and an anode electrode of the light emitting diode when one of the first and second switching transistors is turned off.

14 Claims, 20 Drawing Sheets

(58) Field of Classification Search
CPC ...... G09G 2300/0819; G09G 2310/067; H01L 51/5206
See application file for complete search history.

(56) References Cited

U.S. PATENT DOCUMENTS

| | | | | |
|---|---|---|---|---|
| 2009/0167648 | A1* | 7/2009 | Jeon | G09G 3/3233 345/76 |
| 2010/0141564 | A1 | 6/2010 | Choi et al. | |
| 2010/0149079 | A1* | 6/2010 | Yamashita | G09G 3/3233 345/87 |

* cited by examiner

[TP1_Initial]

[TP2_Vth Compensation]

[TP3_Vth Compensation(floating)]

[TP4_Vblack]

[TP5_Writing & μ Compensation]

[TP6_Emission]

ELECTROLUMINESCENT DISPLAY AND METHOD OF DRIVING THE SAME

CROSS-REFERENCE TO RELATED APPLICATIONS

This application claims the benefit of Republic of Korea Patent Application No. 10-2016-0176663, filed on Dec. 22, 2016, which is hereby incorporated by reference in its entirety.

BACKGROUND

Field of Technology

The present disclosure relates to an electroluminescent display and a method of driving the same.

Discussion of the Related Art

As information technology is developed, a market for a display device, which is a connection medium between a user and information, is increasing. Accordingly, use of display devices such as an electroluminescent display (ELD), a liquid crystal display (LCD), and a plasma display panel (PDP) is increasing.

The electroluminescent display of the display devices described above includes a display panel having a plurality of sub-pixels, and a driver configured to drive the display panel. The driver includes a scan driver configured to supply a scan signal (or a gate signal) to the display panel, and a data driver configured to supply a data signal to the display panel.

The electroluminescent display has a problem that electric characteristics (threshold voltage, electron mobility, etc.) of a driving transistor included in a sub-pixel change during long-time use. In order to compensate for this, conventionally, the electric characteristics of the driving transistor are compensated within the sub-pixel (internal compensation method) or externally compensated (external compensation method).

However, among the conventional compensation method, there is a problem that a block dim (a luminance variation that a luminance of a block shape becomes dark) occurs on the display panel due to a leakage current in the internal compensation, and improvement thereof is required.

SUMMARY

In one aspect, there is provided an electroluminescent display including a driving transistor, a storage capacitor, a first switching transistor, a second switching transistor, a light emitting diode, and a third switching transistor. The driving transistor generates a driving current depending on a gate-source voltage. The storage capacitor stores a data voltage and provides the stored data voltage to a gate electrode of the driving transistor. The first switching transistor controls a gate potential of the driving transistor. The second switching transistor controls a source potential of the driving transistor. The light emitting diode emits light in response to the driving current generated from the driving transistor. The third switching transistor electrically floats a source electrode of the driving transistor and an anode electrode of the light emitting diode when one of the first and second switching transistors is turned off.

In another aspect, there is provided a method of driving an electroluminescent display including a display panel in which sub-pixels which include a light emitting diode and a driving transistor, respectively to display an image and compensate a threshold voltage and an electron mobility of the driving transistor in compliance with a source-follower type internal compensation method are formed, and pixel lines are formed by the sub-pixels, a gate driver configured to drive scan signal lines formed on the display panel, and a data driver configured to drive data lines formed on the display panel. The method of driving the electroluminescent display includes controlling operation of the gate driver and the data driver, while compensating sequentially the threshold voltage and the electron mobility of the driving transistor in a unit of display block of the display panel, compensating simultaneously the threshold voltage of the driving transistor with respect to all the pixel lines belonging to the same display block, and then compensating sequentially the electron mobility of the driving transistor in a unit of pixel line in the same display block. A source electrode of the driving transistor and an anode electrode of the light emitting diode are electrically floated during a period of compensating the threshold voltage and electron mobility of the driving transistor.

In the other aspect, there is provided a method of driving an electroluminescent display including an initialization step, a first threshold voltage compensation step, a second threshold voltage compensation step, a black data voltage writing step, a data voltage writing and an electron mobility compensation step, and a light emission step. The initialization step is applying an initialization voltage to a source node of a driving transistor. The first threshold voltage compensation step is compensating a threshold voltage of the driving transistor. The second threshold voltage compensation step is electrically floating a first switching transistor and a second switching transistor so that the threshold voltage of the driving transistor is stored in a storage capacitor. The black data voltage writing step is writing a black data voltage through a data line. The data voltage writing and the electron mobility compensation step is writing a data voltage through the data line and compensating an electron mobility of the driving transistor. The light emission step is emitting a light emitting diode based on a driving current generated from the driving transistor.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure. In the drawings.

DETAILED DESCRIPTION

Reference will now be made in detail to embodiments of the present disclosure, examples of which are illustrated in the accompanying drawings.

Hereinafter, detailed embodiments of the present disclosure will be described with reference to the accompanying drawings.

A display device according to an embodiment of the present disclosure may be implemented by a television, a video player, a personal computer (PC), a home theater, a smart phone, and the like, but is not limited thereto. An electroluminescent display described below is an example of an organic electroluminescent display implemented based on an organic light emitting diode. However, the electroluminescent display described below may be implemented based on organic light emitting diodes or inorganic light emitting diodes. The present disclosure is not limited to the electroluminescent display but may be applied to a display device of a similar type. In the following description, a thin film transistor will be described as a transistor.

Figure 1:
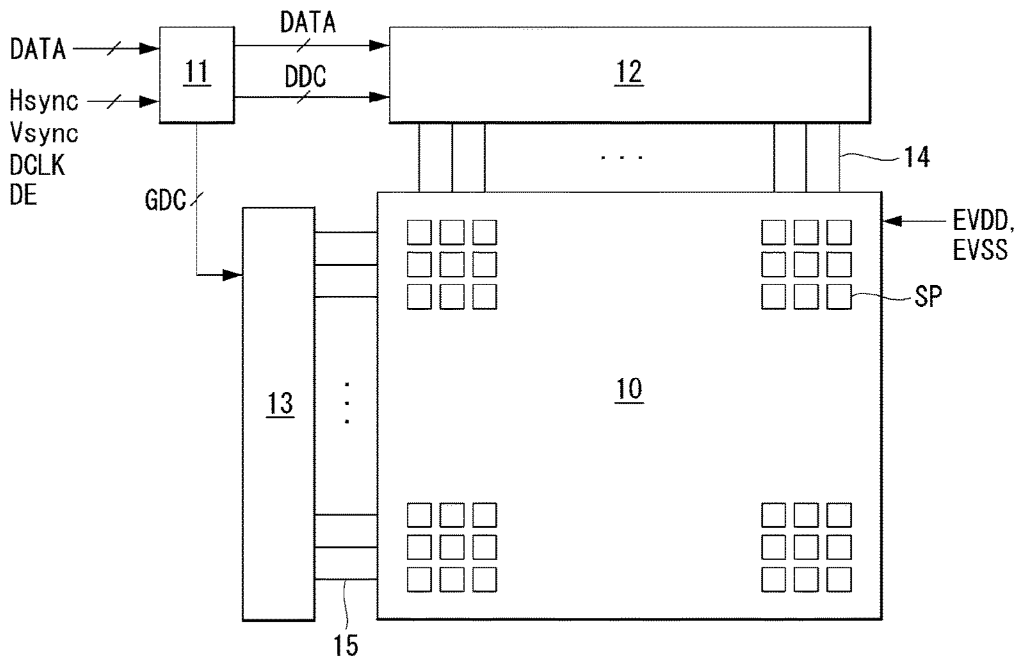
FIG. 1 is a schematic block diagram of an organic electroluminescent display according to an embodiment.
Figure 2:
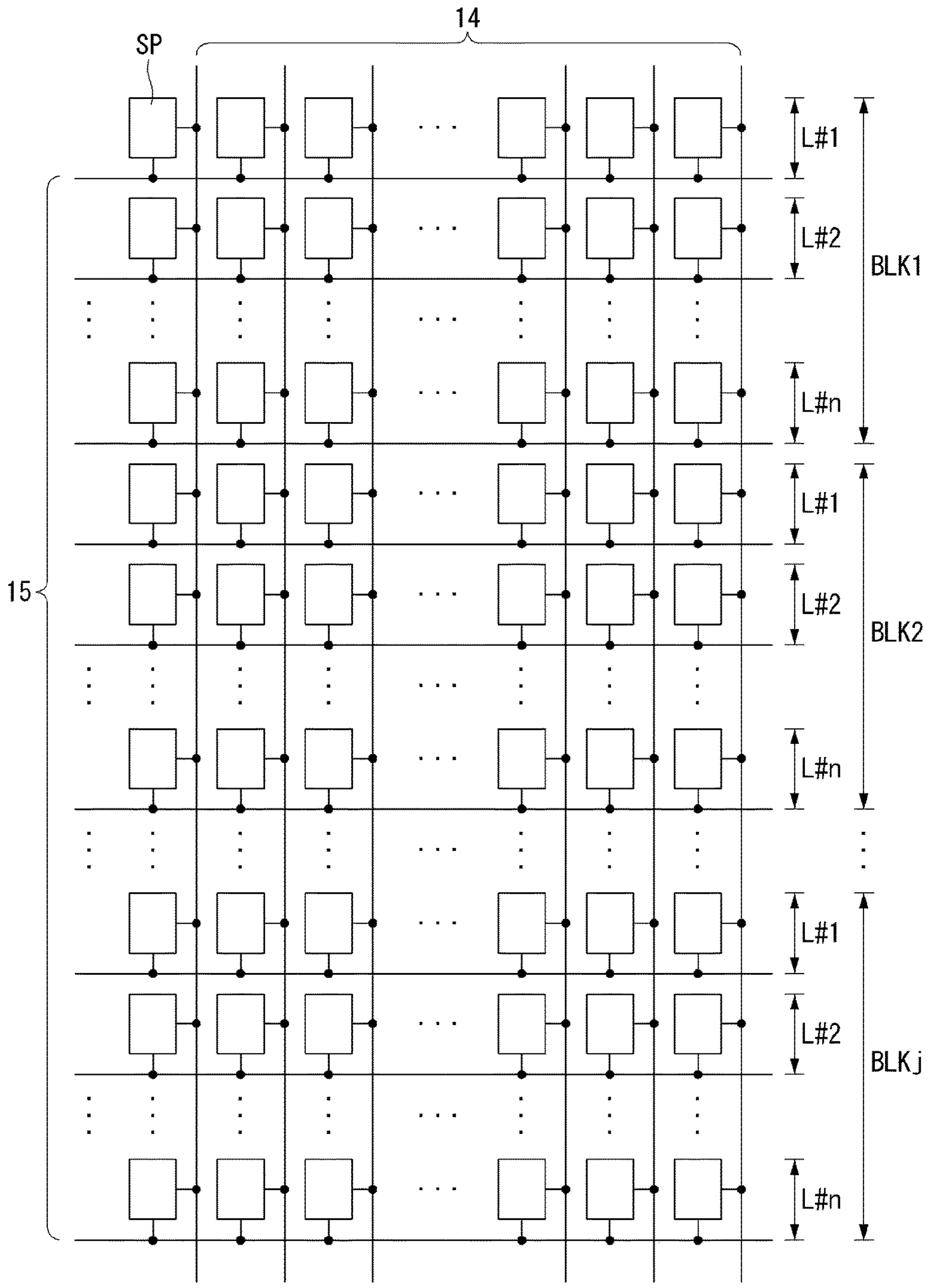
FIG. 2 is a diagram illustrating a pixel array formed on a display panel of FIG. 1 according to an embodiment.
Figure 3:
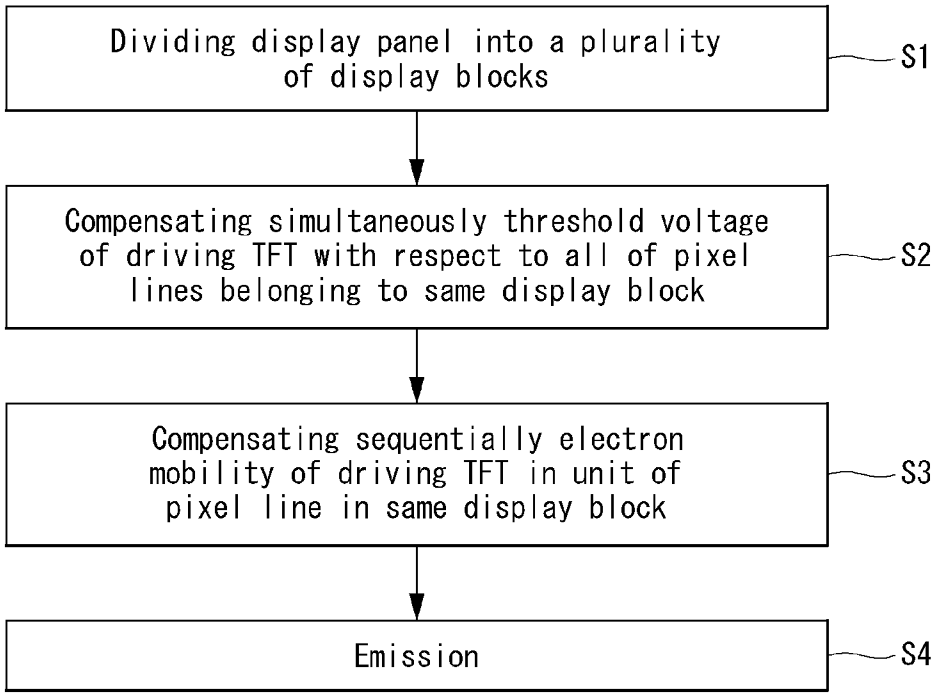
FIG. 3 is a flowchart illustrating a method of driving for sufficiently securing a threshold voltage compensation period in compensating an electrical characteristic deviation of a driving transistor in compliance with a source-follower type internal compensation method according to an embodiment.

FIG. 1 is a schematic block diagram of an organic electroluminescent display. FIG. 2 is a diagram illustrating a pixel array formed on a display panel of FIG. 1. FIG. 3 is a flowchart illustrating a method of driving for sufficiently securing a threshold voltage compensation period in compensating an electrical characteristic deviation of a driving transistor in compliance with a source-follower type internal compensation method.

As shown in FIGS. 1 and 2, an organic electroluminescent display according to an embodiment of the present disclosure includes a display panel 10, a data driver 12, a gate driver 13, and a timing controller 11.

Data lines 14 and scan lines 15 are arranged in the display panel 10. Sub-pixels SP are arranged in each intersection of the data lines 14 and the scan lines 15. The sub-pixels SP are supplied with a high potential driving voltage EVDD and a low potential driving voltage EVSS from a power generating unit (not shown). The sub-pixels SP include an organic light emitting diode and a driving transistor, respectively. The sub-pixels SP compensate a threshold voltage and an electron mobility of the driving transistor in compliance with a source-follower type internal compensation method, and display a desired grayscale holding a gate-source voltage of the driving transistor set for about one frame period at the time of compensation.

The sub-pixels SP include at least one switching transistor that is switched to control a gate potential of the driving transistor. In the sub-pixels SP, a source potential of the driving transistor can be controlled through switching operation of a switching transistor, and in some instances, it can be controlled by swing of the high potential driving voltage. At least one switching transistor of the sub-pixels SP is switched by a scan signal applied from the scan lines 15. The sub-pixels SP may have a different structure as long as the source-follower type internal compensation method can be applied.

A pixel array as shown in FIG. 2 is formed on the display panel 10 by the sub-pixels SP arranged in a matrix form. The pixel array may be divided into a plurality of display blocks BLK1 to BLKj along a supply direction (e.g., vertical direction) of a data signal, and each display block may include a plurality of pixel lines L#1 to L#n. One pixel line means a set of sub-pixels SP arranged in the same horizontal direction and simultaneously receiving a data voltage. The number of the pixel lines L#1 to L#n included in each display block can be set to an appropriate number so as to secure a sufficient threshold voltage compensation period.

The data driver 12 drives the data lines 14 under a control of the timing controller 11. The data driver 12 generates a data voltage corresponding to the data signal DATA in accordance with a data timing control signal DDC applied from the timing controller 11 and supplies the data voltage to the data lines 14. The data voltage means a grayscale voltage for image display. The data voltage may be applied in a multi-step form including an offset voltage and/or a pre-charge voltage together with the grayscale voltage for image display in some instances.

The gate driver 13 drives gate signal supply lines 15 under a control of the timing controller 11. The gate driver 13 generates a scan signal in accordance with a gate timing control signal GDC from the timing controller 11 and supplies the scan signal to the scan lines 15 assigned to respective pixel lines L#1 to L#n. The scan signal supplied to the scan lines 15 of one pixel line includes a gate potential control scan signal used for controlling the gate potential of the driving transistor and a source potential control scan signal used for controlling the source potential of the driving transistor. The gate driver 13 may be formed directly on the display panel 10 in a gate-driver in panel (GIP) manner.

The timing controller 11 generates the data timing control signal DDC for controlling operation timing of the data driver 12 and the gate timing control signal GDC for controlling operation timing of the gate driver 13 based on timing signals such as a vertical synchronization signal Vsync, a horizontal synchronization signal Hsync, a dot clock signal DCLK, and a data enable signal DE. The timing controller 11 processes the data signal DATA applied from an external video source (not shown) and supplies the processed data signal to the data driver 12.

The timing controller 11 controls operation of the data driver 12 and the gate driver 13. While the timing controller 11 sequentially compensates the threshold voltage and the electron mobility of the driving transistor in a unit of display block, the timing controller 11 simultaneously compensates the threshold voltage of the driving transistor with respect to all pixel lines L#1 to L#n belonging to the same display block. The timing controller 11 can sequentially compensate the electron mobility of the driving transistor in a unit of pixel line in the same display block in order to sufficiently secure the threshold voltage compensation period within one frame period to improve a compensation performance.

Unlike the related art, the embodiment of the present disclosure simultaneously allocates time required for threshold voltage compensation for each display block to simultaneously compensate the threshold voltage in one display block, and then compensates the electron mobility by writing a data voltage in a line sequential manner in the corresponding display block. The time (block compensation time) allocated to the threshold voltage compensation can be determined depending on the number of pixel lines belonging to one display block. The block compensation time can be set to an appropriate size in consideration of a threshold voltage compensation performance and the like.

As shown in FIGS. 1 and 3, the embodiment of the present disclosure divides the display panel 10 into the plurality of display blocks BLK1 to BLKj including the plurality of pixel lines L#1 to L#n, respectively (S1). While the embodiment of the present disclosure sequentially compensates the threshold voltage and the electron mobility of the driving transistor in a unit of display block, the embodiment of the present disclosure simultaneously compensates the threshold voltage of the driving transistor with respect to all of the pixel lines L#1 to L#n belonging to the same display block (S2). The embodiment of the present disclosure sequentially compensates the electron mobility of the driving transistor in a unit of pixel line in the same display block (S3). The embodiment of the present disclosure implements grayscale by applying and emitting a driving current determined by the gate-source voltage of the driving transistor set at the time of compensation to the organic light emitting diode of each sub-pixel SP (S4).

The electrical characteristics deviation of the driving transistor is compensated by the method of FIG. 3. However, a method of driving in which a compensation operation is performed without overlapping between neighboring display blocks will be described as follows.

Figure 4:
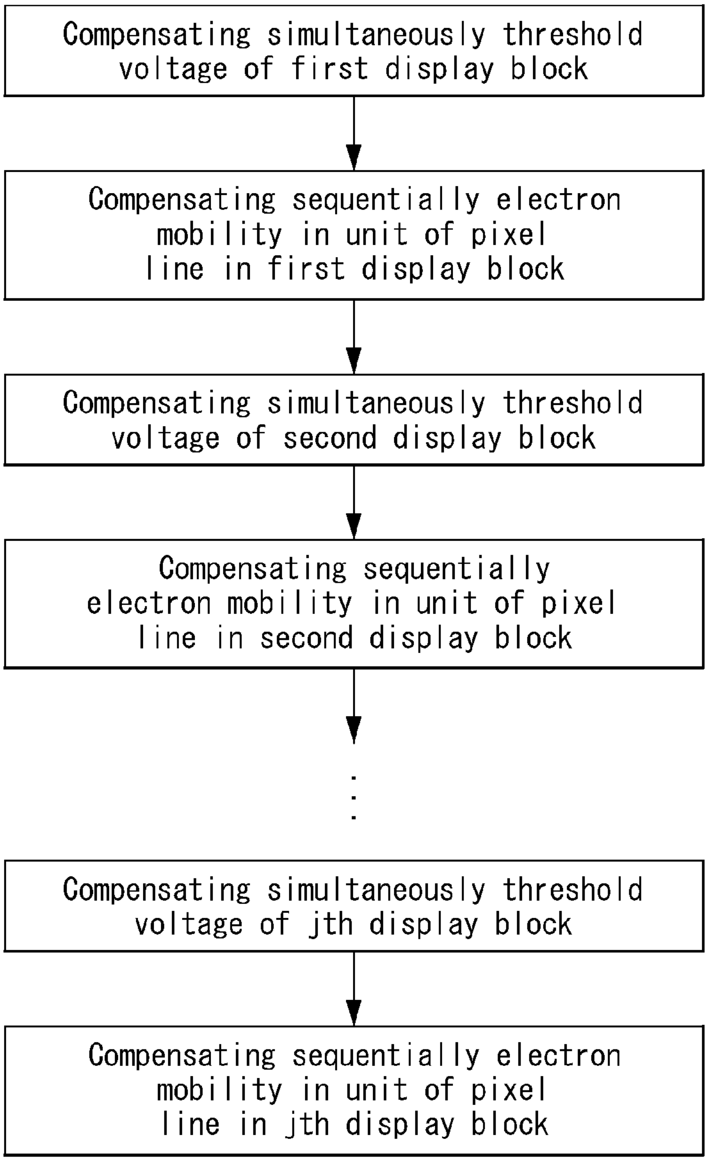
FIGS. 4 to 6 are diagrams illustrating a method of driving in which a non-overlapping compensating operation is performed between neighboring display blocks while compensating an electric characteristic deviation of a driving transistor by a method of FIG. 3 according to an embodiment.
Figure 5:
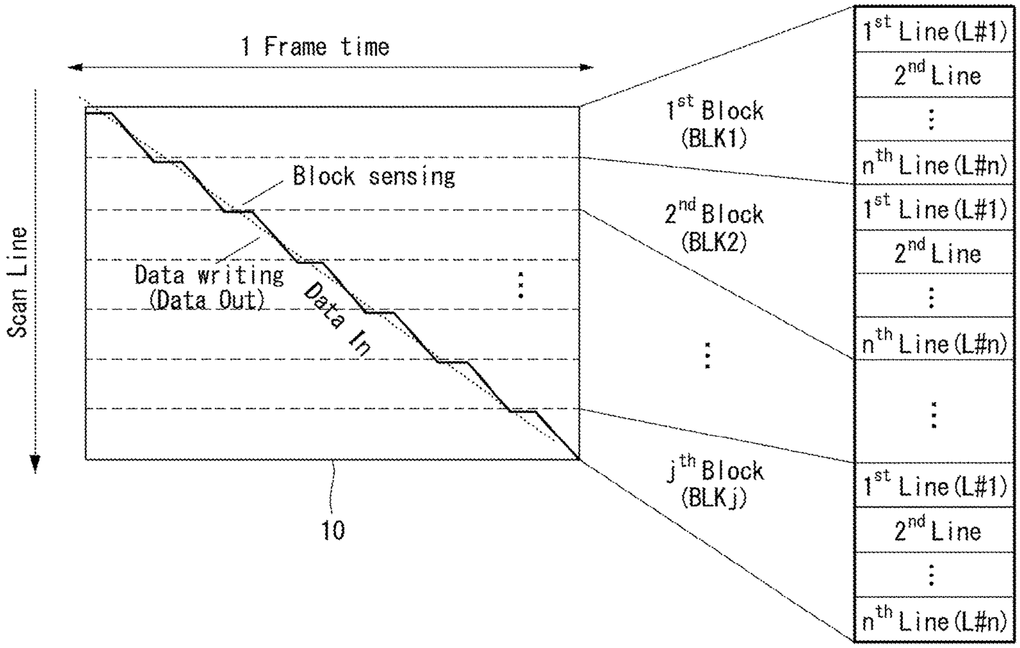
Figure 6:
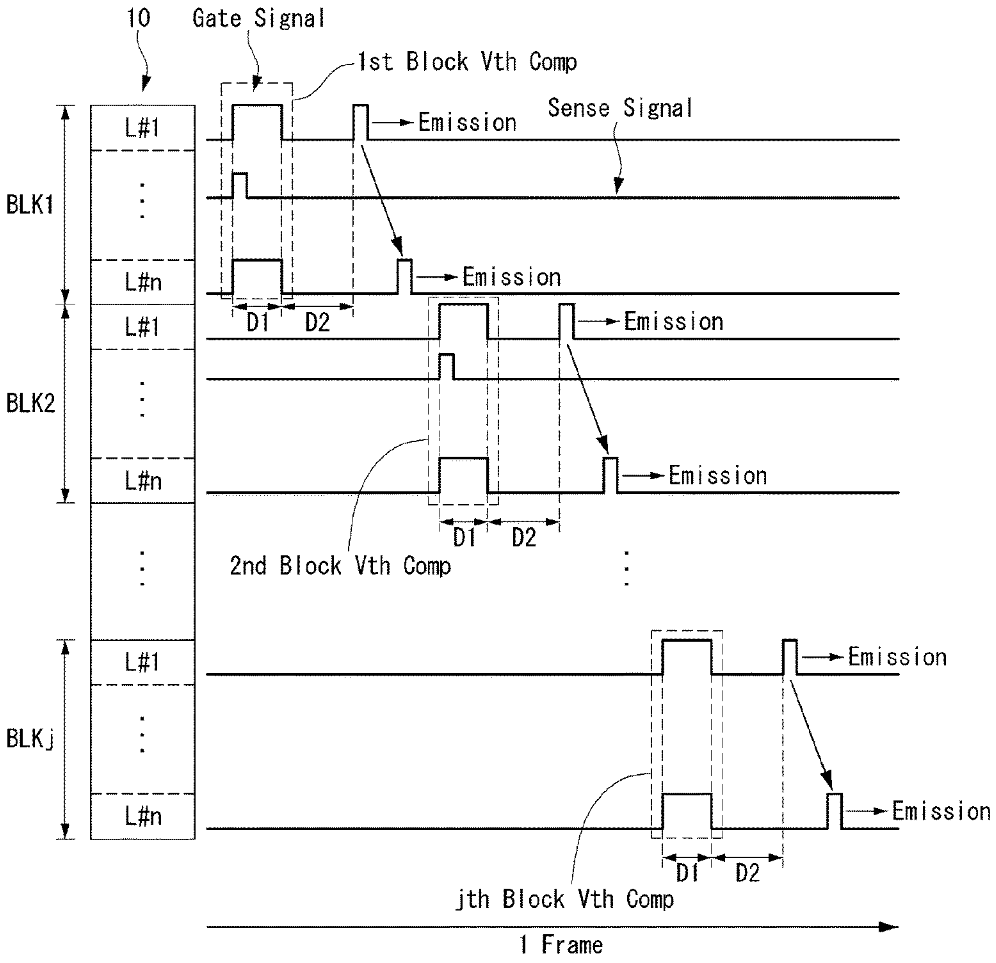
Figure 7:
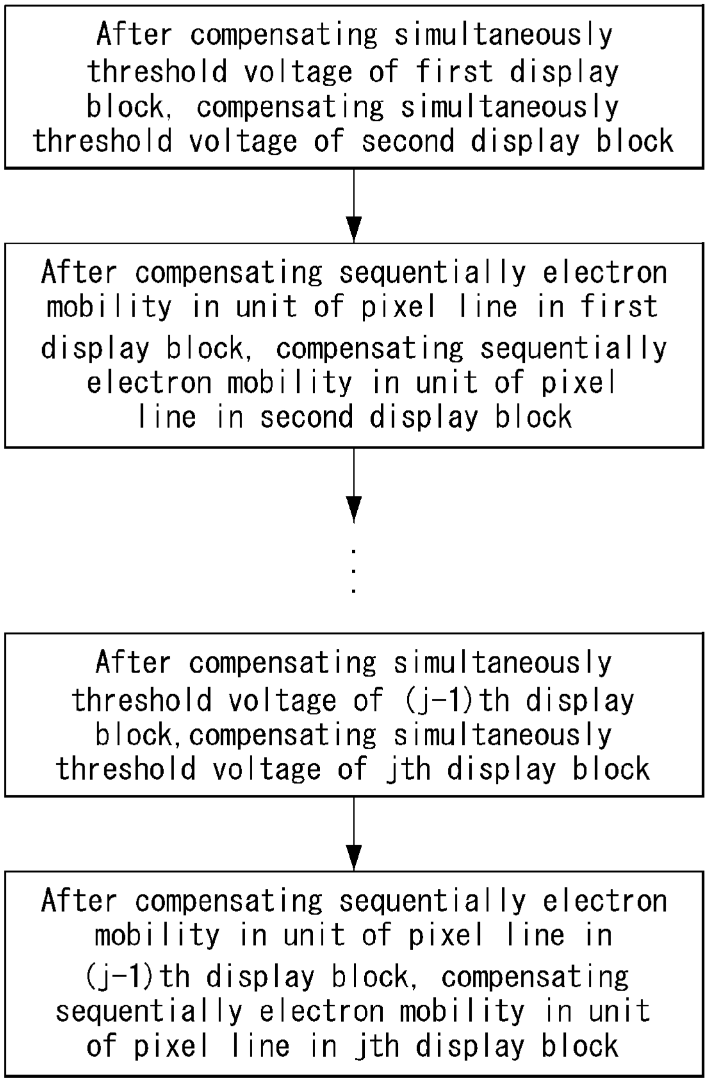
FIG. 7 is a diagram illustrating a method of driving in which an overlapping compensating operation is performed between neighboring display blocks while compensating an electric characteristic deviation of a driving transistor by a method of FIG. 3 according to an embodiment.

FIGS. 4 to 6 are diagrams illustrating a method of driving in which a non-overlapping compensating operation is performed between neighboring display blocks while compensating an electric characteristic deviation of a driving transistor by a method of FIG. 3. FIG. 7 is a diagram illustrating a method of driving in which an overlapping compensating operation is performed between neighboring display blocks while compensating an electric characteristic deviation of a driving transistor by a method of FIG. 3.

As shown in FIGS. 4 to 6, a display blocks BLK1 to BLKj can perform a non-overlapping compensation operation with each other. The non-overlapping compensation operation will be described as follows.

First, a threshold voltage of a driving transistor is simultaneously compensated for pixel lines L#1 to L#n of a first display block BLK1. This process may be defined as a compensation period (1st Block Vth Comp) of the first display block BLK1. Thereafter, an electron mobility of the driving transistor is sequentially compensated in a unit of pixel line in the first display block BLK1.

Next, a threshold voltage of a driving transistor is simultaneously compensated for pixel lines L#1 to L#n of a second display block BLK2. This process may be defined as a compensation period (2nd Block Vth Comp) of the second display block BLK2. Thereafter, an electron mobility of the driving transistor is sequentially compensated in a unit of pixel line in the second display block BLK2.

The embodiment of the present disclosure compensates the threshold voltage and the electron mobility of the driving transistor from the first display block BLK1 to the jth display block BLKj in this manner. On the other hand, the compensation period of each display block is determined as described above, but an emission period in which the display blocks BLK1 to BLKj of a display panel 10 emit substantiality light is sequentially performed for each scan line.

In each display block in FIG. 6, a period during which the threshold voltage of the driving transistor is simultaneously compensated is denoted by "D1", and a period until a data voltage is written after the threshold voltage compensation is denoted by "D2". The electron mobility compensation of the driving transistors is performed simultaneously with the writing of the data voltage.

Among signals applied to the display panel, "Gate Signal" (logic high) is a gate potential control scan signal used to control a gate potential of the driving transistor, and "Sense Signal" (logic high) is a source potential control scan signal used to control a source potential of the driving transistor.

On the other hand, as shown in FIG. 7, a method of driving in which an overlapping compensation operation is performed between neighboring display blocks may be selected as a method of compensating the electrical characteristic deviation of the driving transistor by the method of FIG. 3. The overlapping compensation operation will be described as follows.

First, after the threshold voltage of the driving transistor is simultaneously compensated for the pixel lines L#1 to L#n of the first display block BLK1, the threshold voltage of the driving transistor is simultaneously compensated for the pixel lines L#1 to L#n of the second display block BLK2.

Next, after the electron mobility of the driving transistor is sequentially compensated in a unit of pixel line in the first display block BLK1 in which the threshold voltage of the driving transistor is simultaneously compensated, the electron mobility of the driving transistor is sequentially compensated in a unit of pixel line in the second display block BLK2 in which the threshold voltage of the driving transistor is simultaneously compensated. The embodiment of the present disclosure compensates the threshold voltage and the electron mobility of the driving transistor from the first display block BLK1 to the jth display block BLKj in this manner.

As described above, configuration of a sub-pixel circuit must be supported in order to compensate the driving transistor in a unit of display block. Hereinafter, the configuration of the sub-pixel circuit and a method of driving the same that can be implemented in the embodiment of the present disclosure will be described but not limited thereto.

First Embodiment

Figure 8:
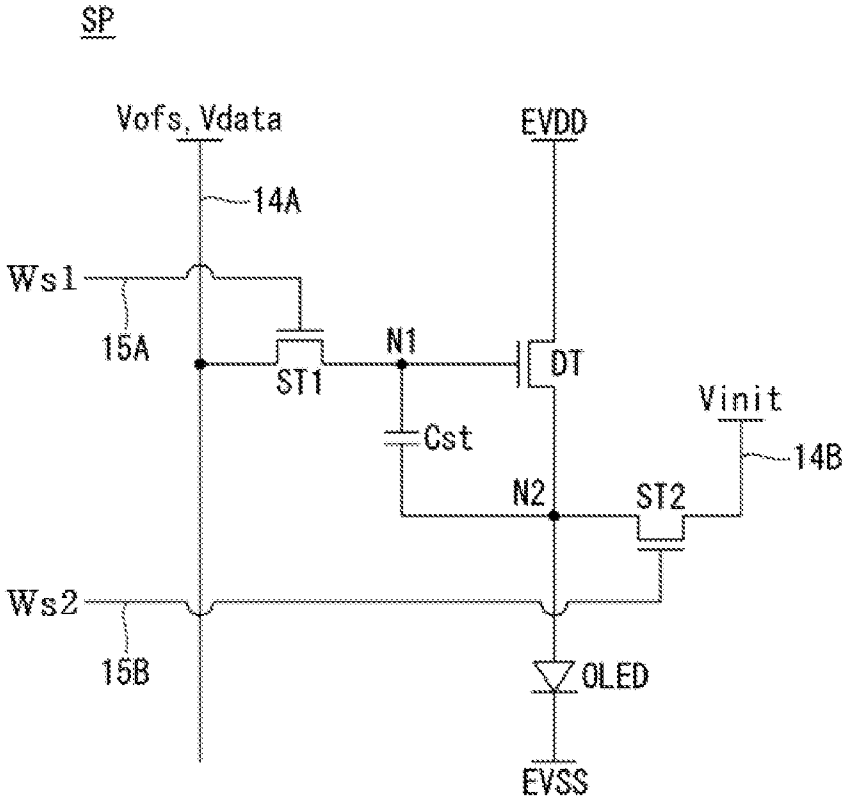
FIG. 8 is a circuit configuration diagram of a sub-pixel according to a first embodiment of the present disclosure.
Figure 9:
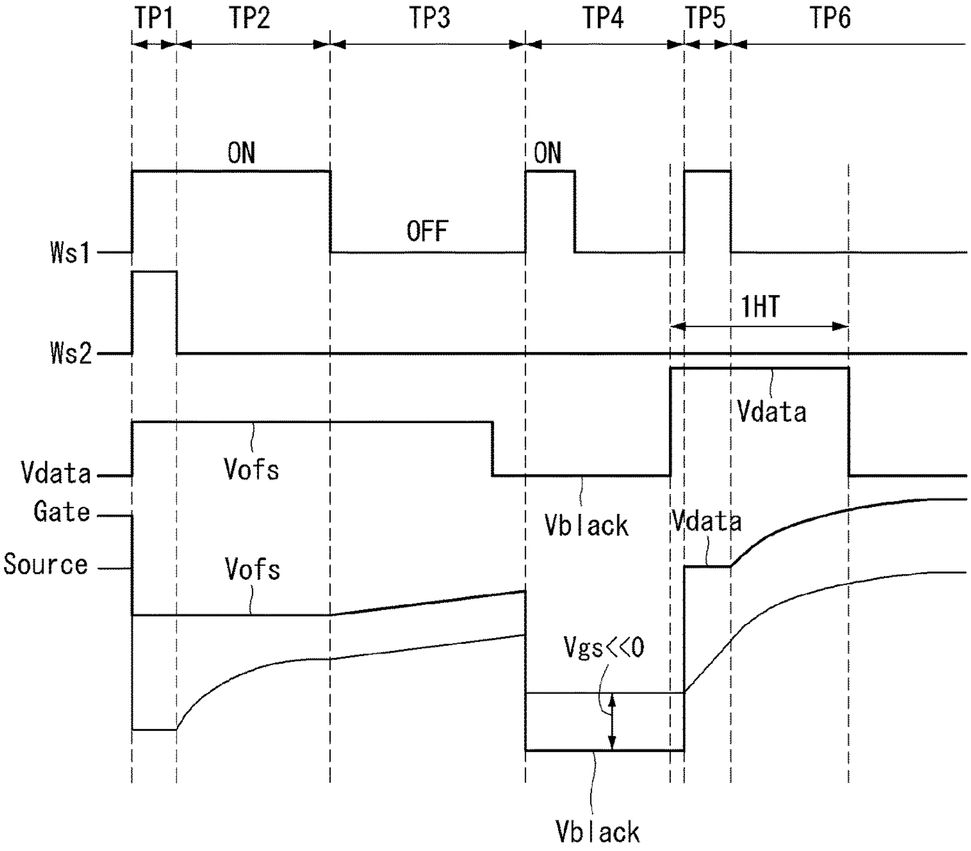
FIG. 9 is a diagram illustrating driving waveforms of a sub-pixel shown in FIG. 8.

FIG. 8 is a circuit configuration diagram of a sub-pixel according to a first embodiment of the present disclosure. FIG. 9 is a diagram illustrating driving waveforms of a sub-pixel shown in FIG. 8.

As shown in FIG. 8, a sub-pixel SP may include an organic light emitting diode OLED, a driving transistor DT, a storage capacitor Cst, a first switching transistor ST1, and a second switching transistor ST2. A semiconductor layer of the transistors constituting the sub-pixel SP may include amorphous silicon, polysilicon or an oxide.

The driving transistor DT, the first switching transistor ST1, and the second switching transistor ST2 may be of N type, but are not limited thereto. The N-type transistors are turned on in response to a scan signal of logic high and turned off in response to a scan signal of logic low.

The organic light emitting diode OLED emits light in response to a driving current generated from the driving transistor DT. The organic light emitting diode OLED includes an anode electrode connected to a source node N2, a cathode electrode connected to a low potential driving voltage terminal EVSS, and an organic compound layer disposed between the anode electrode and the cathode electrode.

The driving transistor DT controls the driving current flowing in the organic light emitting diode OLED depending on a gate-source voltage Vgs. The driving transistor DT includes a gate electrode connected to a gate node N1, a drain electrode connected to a high potential driving voltage terminal EVDD, and a source electrode connected to the source node N2.

The storage capacitor Cst stores a data voltage and provides the stored data voltage to the gate electrode of the driving transistor DT. One end of the storage capacitor Cst is connected to the gate node N1 and other end is connected to the source node N2.

The first switching transistor ST1 is switched depending on a gate potential control scan signal (first A scan signal) to control a gate potential (gate node N1 potential) of the driving transistor DT. The first switching transistor ST1 includes a gate electrode connected to a first A scan line 15A, a drain electrode connected to a data line 14A, and a source electrode connected to the gate node N1.

The second switching transistor ST2 is switched depending on a source potential control scan signal (first B scan signal) to control a source potential (source node N2 potential) of the driving transistor DT. The second switching transistor ST2 includes a gate electrode connected to a first B scan line 15B, a drain electrode connected to the source node N2, and a source electrode connected to a reference line 14B. The reference line 14B is used to transmit an initialization voltage, a reference voltage, or the like, or to sense the source node N2. The reference line 14B may be connected to the data driver 12 or may be connected to a separate reference output circuit (not shown).

As shown in FIGS. 8 and 9, the sub-pixel SP operates in an order of an initialization period TP1, a first threshold voltage compensation period TP2, a second threshold voltage compensation period TP3, a black data voltage writing period TP4, a data voltage writing and an electron mobility compensation period TP5, and a light emission period TP6.

The initialization period TP1 is a period for applying the initialization voltage Vinit to the source node N2. The first switching transistor ST1 is turned on in response to the gate potential control scan signal Ws1. The second switching transistor ST2 is turned on in response to the source potential control scan signal Ws2. During this period, an offset voltage Vofs is supplied to the data line and the initialization voltage Vinit is supplied to the reference line. Thus, the offset voltage Vofs is applied to the gate node N1, and the initialization voltage Vinit is applied to the source node N2. As a result, the driving transistor DT is turned on since the gate-source voltage becomes higher than a threshold voltage.

The first threshold voltage compensation period TP2 is a period for compensating the threshold voltage of the driving transistor DT. The first switching transistor ST1 is maintained in a turned-on state in response to the gate potential control scan signal Ws1. The second switching transistor ST2 is turned off in response to the source potential control scan signal Ws2. During this period, the offset voltage Vofs is supplied to the data line. Thus, the gate potential Gate of the driving transistor DT is maintained at the offset voltage Vofs. As a result, the source potential of the driving transistor DT gradually rises from the initialization voltage to the threshold voltage by the current Ids flowing between the drain and the source of the driving transistor DT. The compensated threshold voltage of the driving transistor DT during this period is stored in the storage capacitor Cst.

The second threshold voltage compensation period TP3 is a period during which the transistors ST1 and ST2 are electrically floated so that the threshold voltage of the driving transistor DT is stored with sufficient time in the storage capacitor Cst. The first switching transistor ST1 and the second switching transistor ST2 are turned off in response to the gate potential control scan signal Ws1 and the source potential control scan signal Ws2. In addition, the transistors ST1, ST2, and DT of all the pixel lines belonging to the same display block are electrically turned off during the second threshold voltage compensation period TP3.

The black data voltage writing period TP4 is a period for writing a black data voltage Vblack through the data line. The first switching transistor ST1 is turned on in response to the gate potential control scan signal Ws1. The second switching transistor ST2 is maintained in a turned-off state in response to the source potential control scan signal Ws2. During this period, the data line is supplied with the black data voltage Vblack. As a result, a problem that the gate-source voltage of the driving transistor DT set through the threshold voltage compensation varies for each sub-pixel is minimized.

On the other hand, when the black data voltage Vblack is applied, the gate-source voltage Vgs of the driving transistor DT becomes much lower than the threshold voltage (Vth, for example, "0V") of the driving transistor DT. Therefore, a leakage current generated from the driving transistor DT is cut off.

The data voltage writing and the electron mobility compensation period TP5 is a period for writing the data voltage and compensating the electron mobility. The first switching transistor ST1 is turned on in response to the gate potential control scan signal Ws1. The second switching transistor ST2 is maintained in a turned-off state in response to the source potential control scan signal Ws2. During this period, a data voltage Vdata is supplied to the data line. Thus, the data voltage Vdata is applied to the gate node N1 of the driving transistor DT, and the gate potential Gate of the driving transistor DT rises from a level of the black data voltage Vblack to a level of the data voltage Vdata. Then, the source potential (Source) also rises in accordance with the electron mobility characteristic of the driving transistor DT. The storage capacitor Cst stores a voltage ($Vdata+Vth-\Delta V\mu$) obtained by subtracting a voltage variation ($\Delta V\mu$) in accordance with the electron mobility characteristic from a sum of the data voltage (Vdata) and the threshold voltage (Vth). As a result, the electron mobility of the driving transistor DT is compensated.

The light emission period TP6 is a period for applying the driving current to the organic light emitting diode OLED to emit light. The first switching transistor ST1 and the second switching transistor ST2 are turned off in response to the gate potential control scan signal Ws1 and the source potential control scan signal Ws2. The driving transistor DT is turned on by the voltage level ($Vdata+Vth-\Delta V\mu$) stored in the storage capacitor Cst, and supplies the organic light emitting diode OLED with a driving current in which the threshold voltage Vth and the electron mobility are compensated. As a result, the organic light emitting diode OLED emits light based on the driving current whose electric characteristics are compensated.

On the other hand, during the second threshold voltage compensation period TP3 (floating period) included in the driving period for each display block for internal compensation in the first embodiment, a leakage current may be caused by a capacitor (OLED cap) component existing in the organic light emitting diode (OLED). However, a second embodiment described below can prevent the leakage current problem caused by the capacitor (OLED cap) component existing in the organic light emitting diode (OLED).

Second Embodiment

Figure 10:
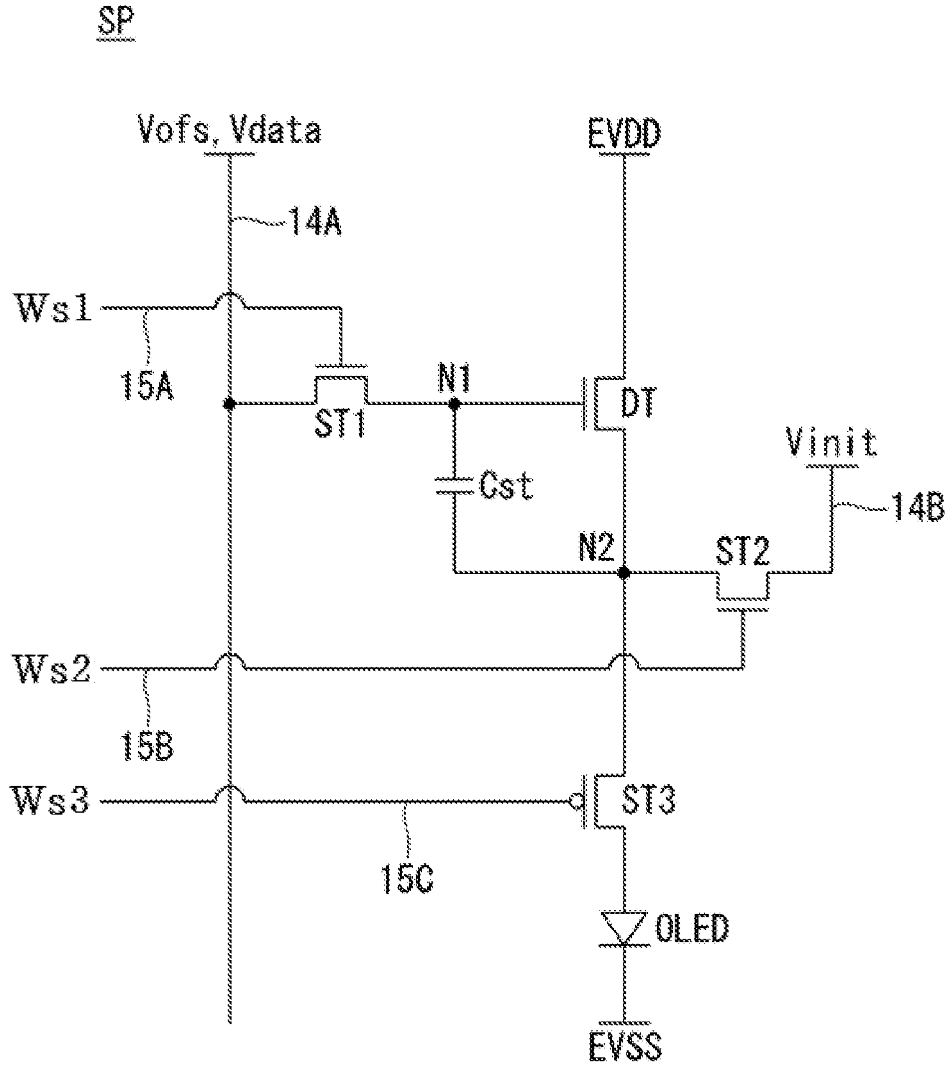
FIG. 10 is a circuit configuration diagram of a sub-pixel according to a second embodiment of the present disclosure.
Figure 11:
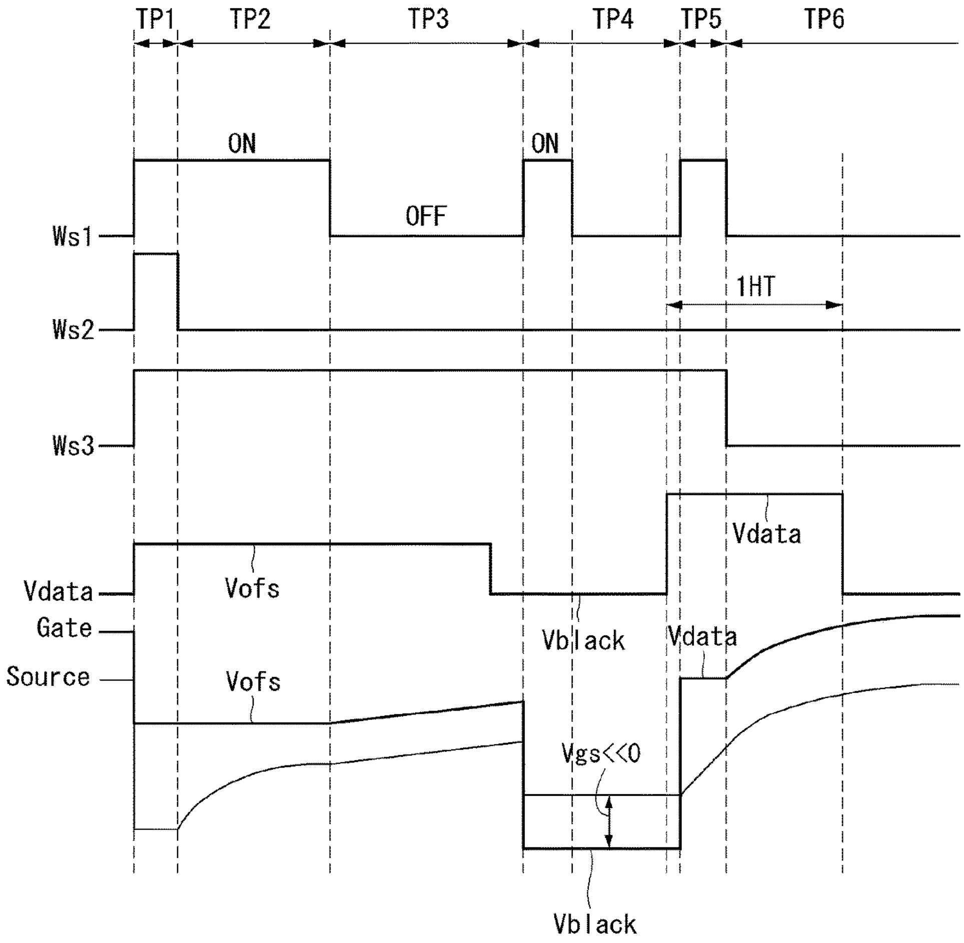
FIG. 11 is a diagram illustrating driving waveforms of a sub-pixel shown in FIG. 10 according to an embodiment.

FIG. 10 is a circuit configuration diagram of a sub-pixel according to a second embodiment of the present disclosure. FIG. 11 is a diagram illustrating driving waveforms of a sub-pixel shown in FIG. 10. FIGS. 12 to 17 are diagrams illustrating operation states by period of a sub-pixel according to a second embodiment of the present disclosure.

As shown in FIG. 10, a sub-pixel SP may include an organic light emitting diode OLED, a driving transistor DT, a storage capacitor Cst, a first switching transistor ST1, a second switching transistor ST2, and a third switching transistor ST3. A semiconductor layer of the transistors constituting the sub-pixel SP may include amorphous silicon, polysilicon or an oxide.

The driving transistor DT, the first switching transistor ST1 and the second switching transistor ST2 may be of N type, and the third switching transistor ST3 may be of P type, but not limited thereto. The N-type transistors are turned on in response to a scan signal of logic high and turned off in response to a scan signal of logic low. On the contrary, the P N-type transistors are turned off in response to the scan signal of logic high and turned on in response to the scan signal of logic low.

The organic light emitting diode OLED emits light in response to a driving current generated from the driving transistor DT. The organic light emitting diode OLED includes an anode electrode connected to a source node N2, a cathode electrode connected to a low potential driving voltage terminal EVSS, and an organic compound layer disposed between the anode electrode and the cathode electrode.

The driving transistor DT controls the driving current flowing in the organic light emitting diode OLED depending on a gate-source voltage Vgs. The driving transistor DT includes a gate electrode connected to a gate node N1, a drain electrode connected to a high potential driving voltage terminal EVDD, and a source electrode connected to the source node N2.

The storage capacitor Cst stores a data voltage and provides the stored data voltage to the gate electrode of the driving transistor DT. One end of the storage capacitor Cst is connected to the gate node N1 and the other end is connected to the source node N2.

The first switching transistor ST1 is switched depending on a gate potential control scan signal (first A scan signal Ws1) to control a gate potential (gate node N1 potential) of the driving transistor DT. The first switching transistor ST1 includes a gate electrode connected to a first A scan line 15A, a drain electrode connected to a data line 14A, and a source electrode connected to the gate node N1.

The second switching transistor ST2 is switched depending on a source potential control scan signal (first B scan signal Ws2) to control a source potential (source node N2 potential) of the drive transistor DT. The second switching transistor ST2 includes a gate electrode connected to a first B scan line 15B, a drain electrode connected to the source node N2, and a source electrode connected to a reference line 14B. The reference line 14B is used to transmit a reference voltage Vref or the like or to sense the source node N2. The reference line 14B may be connected to the data driver 12 or may be connected to a separate reference output circuit (not shown).

The third switching transistor ST3 is switched depending on a leakage preventing scan signal (first C scan signal Ws3) to electrically float the source node N2 of the driving transistor DT and the anode electrode of the organic light emitting diode OLED. The third switching transistor ST3 includes a gate electrode connected to a first C scan line 15C, a drain electrode connected to the source node N2 of the driving transistor DT, and a source electrode connected to the anode electrode of the organic light emitting diode OLED.

As shown in FIGS. 10 to 17, the sub-pixel SP operates in an order of an initialization period TP1, a first threshold voltage compensation period TP2, a second threshold voltage compensation period TP3, a black data voltage writing period TP4, a data voltage writing and an electron mobility compensation period TP5, and a light emission period TP6.

Figure 12:
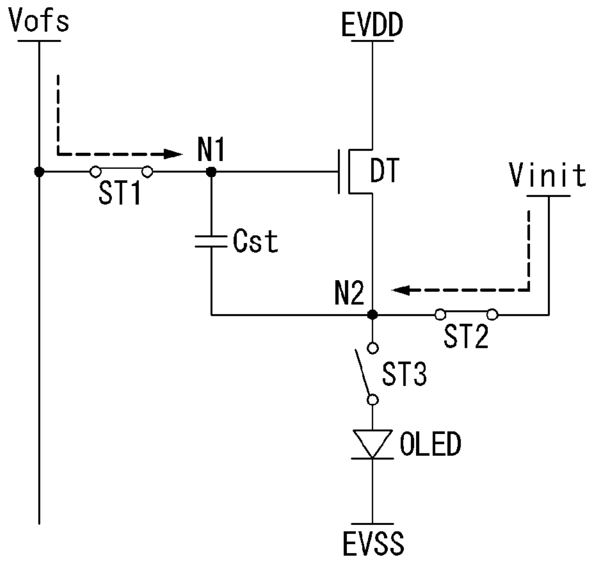
FIGS. 12 to 17 are diagrams illustrating operation states by period of a sub-pixel according to a second embodiment of the present disclosure.

As shown in FIGS. 11 and 12, the initialization period TP1 is a period for applying the initialization voltage Vinit to the source node N2. The first switching transistor ST1 is turned on in response to the gate potential control scan signal Ws1. The second switching transistor ST2 is turned on in response to the source potential control scan signal Ws2. The third switching transistor ST3 is turned off in response to the leakage preventing scan signal Ws3. During this period, an offset voltage Vofs is supplied to the data line and the initialization voltage Vinit is supplied to the reference line. Thus, the offset voltage Vofs is applied to the gate node N1, and the initialization voltage Vinit is applied to the source node N2. As a result, the driving transistor DT is turned on since the gate-source voltage becomes higher than a threshold voltage.

Figure 13:
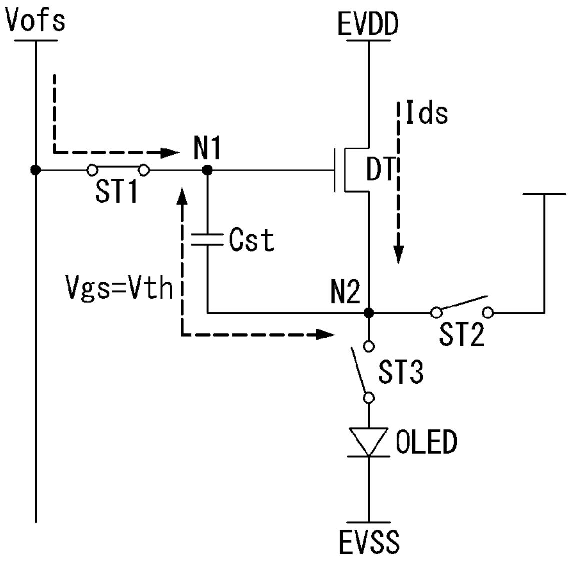

As shown in FIGS. 11 and 13, the first threshold voltage compensation period TP2 is a period for compensating the threshold voltage of the driving transistor DT. The first switching transistor ST1 is maintained in a turned-on state in response to the gate potential control scan signal Ws1. The second switching transistor ST2 is turned off in response to the source potential control scan signal Ws2. The third switching transistor ST3 is maintained in a turned-off state in response to the leakage preventing scan signal Ws3. During this period, the offset voltage Vofs is supplied to the data line. Thus, the gate potential Gate of the driving transistor DT is maintained at the offset voltage Vofs. As a result, the source potential of the driving transistor DT gradually rises from the initialization voltage to the threshold voltage by the current Ids flowing between the drain and the source of the driving transistor DT. The compensated threshold voltage of the driving transistor DT during this period is stored in the storage capacitor Cst. A leakage current generated from the organic light emitting diode OLED is cut off by the third switching transistor ST3.

Figure 14:
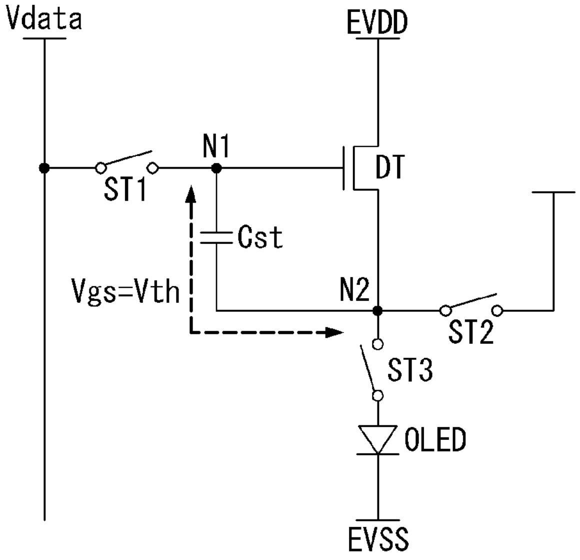

As shown in FIGS. 11 and 14, the second threshold voltage compensation period TP3 is a period during which the transistors ST1 and ST2 are electrically floated so that the threshold voltage of the driving transistor DT is stored with sufficient time in the storage capacitor Cst. The first switching transistor ST1 and the second switching transistor ST2 are turned off in response to the gate potential control scan signal Ws1 and the source potential control scan signal Ws2. The third switching transistor ST3 is maintained in a turned-off state in response to the leakage preventing scan signal Ws3. As a result, the transistors ST1 and ST2 are electrically floated, but the leakage current that may be generated from the organic light emitting diode OLED is cut off by the third switching transistor ST3.

Figure 15:
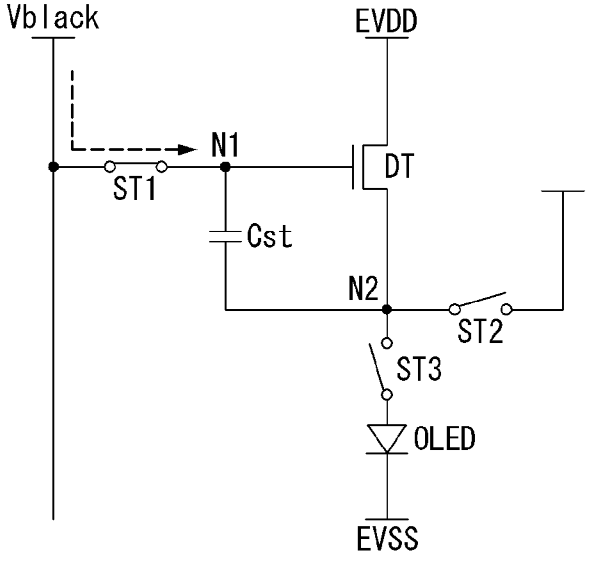

As shown in FIGS. 11 and 15, the black data voltage writing period TP4 is a period for writing a black data voltage Vblack through the data lines. The first switching transistor ST1 is turned on in response to the gate potential control scan signal Ws1. The second switching transistor ST2 is maintained in a turned-off state in response to the source potential control scan signal Ws2. The third switching transistor ST3 is maintained in a turned-off state in response to the leakage preventing scan signal Ws3. During this period, the data line is supplied with the black data voltage Vblack. As a result, a problem that the gate-source voltage of the driving transistor DT set through the threshold voltage compensation varies for each sub-pixel is minimized.

On the other hand, when the black data voltage Vblack is applied, the gate-source voltage Vgs of the driving transistor DT is much lower than the threshold voltage (Vth, for example, "0V") of the driving transistor DT. Therefore, a leakage current generated from the driving transistor DT is cut off. The leakage current generated from the organic light emitting diode OLED is also cut off by the third switching transistor ST3.

Figure 16:
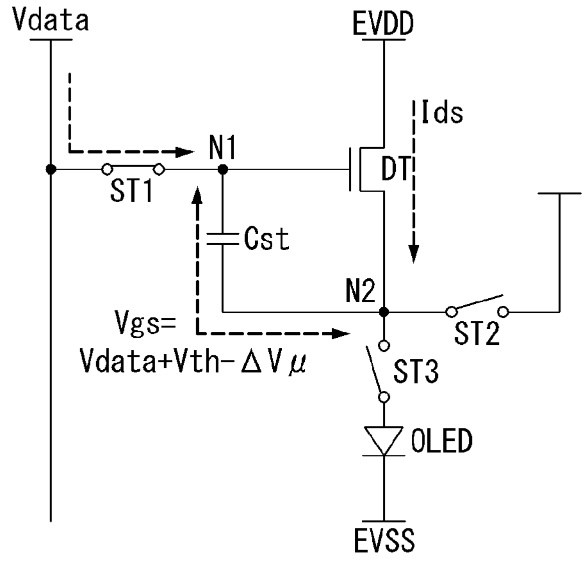

As shown in FIGS. 11 and 16, the data voltage writing and the electron mobility compensation period TP5 is a period for writing the data voltage and compensating for the electron mobility. The first switching transistor ST1 is turned on in response to the gate potential control scan signal Ws1. The second switching transistor ST2 is maintained in a turned-off state in response to the source potential control scan signal Ws2. During this period, a data voltage Vdata is supplied to the data line. The third switching transistor ST3 is maintained in a turned-off state in response to the leakage preventing scan signal Ws3. Thus, the data voltage Vdata is applied to the gate node N1 of the driving transistor DT, and the gate potential Gate of the driving transistor DT rises from a level of the black data voltage Vblack to a level of the data voltage Vdata. Then, the source potential (Source) also rises in accordance with the electron mobility characteristics of the driving transistor DT. As a result, the storage capacitor Cst stores a voltage ($Vdata+Vth-\Delta V\mu$) obtained by subtracting a voltage variation ($\Delta V\mu$) in accordance with the electron mobility characteristic from a sum of the data voltage (Vdata) and the threshold voltage (Vth). As a result, the electron mobility of the driving transistor DT is compensated. The leakage current generated from the organic light emitting diode OLED is also cut off by the third switching transistor ST3.

Figure 17:
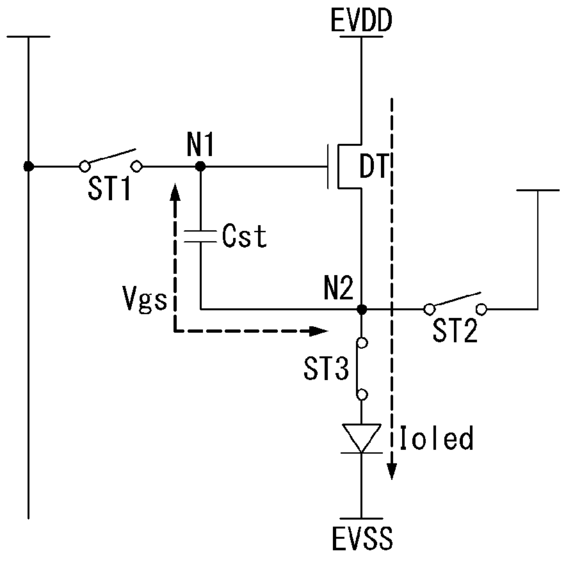

As shown in FIGS. 11 and 17, the light emission period TP6 is a period for applying the driving current to the organic light emitting diode OLED to emit light. The first switching transistor ST1 and the second switching transistor ST2 are turned off in response to the gate potential control scan signal Ws1 and the source potential control scan signal Ws2. The third switching transistor ST3 is turned on in response to the leakage preventing scan signal Ws3. The driving transistor DT is turned on by the voltage level ($Vdata+Vth-\Delta V\mu$) stored in the storage capacitor Cst, and supplies the organic light emitting diode OLED with a driving current in which the threshold voltage Vth and the electron mobility $\mu$ are compensated. As a result, the organic light emitting diode OLED emits light based on the driving current whose electric characteristics are compensated.

On the other hand, in the second embodiment, the third switching transistor ST3 is turned off for a long time in order to prevent a leakage current problem caused by a capacitor (OLED cap) component existing in the organic light emitting diode (OLED) as an example. This period is a period for preventing current leakage of the organic light emitting diode. However, this is only an example, and the turn-off state of the third switching transistor ST3 may be changed as follows.

Figure 18:
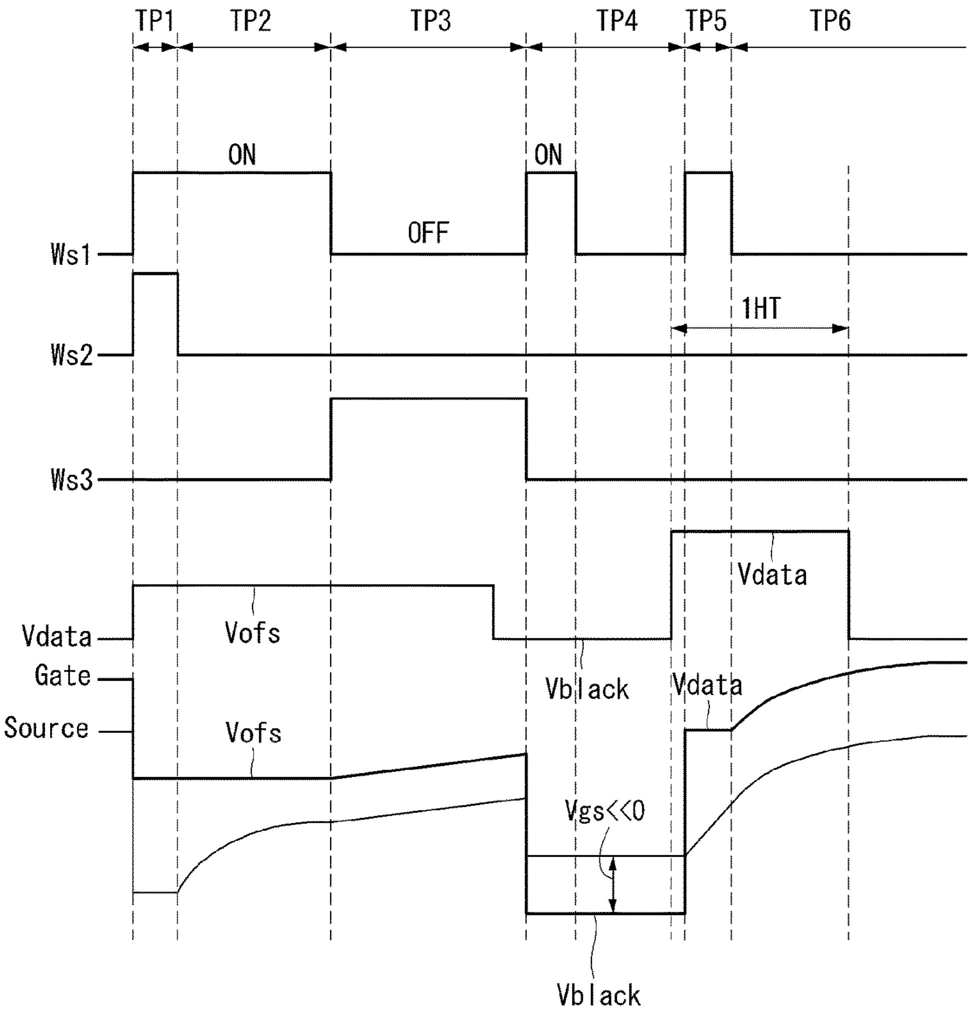
FIG. 18 is a first modification illustrating driving waveforms of a sub-pixel shown in FIG. 10 according to an embodiment.
Figure 19:
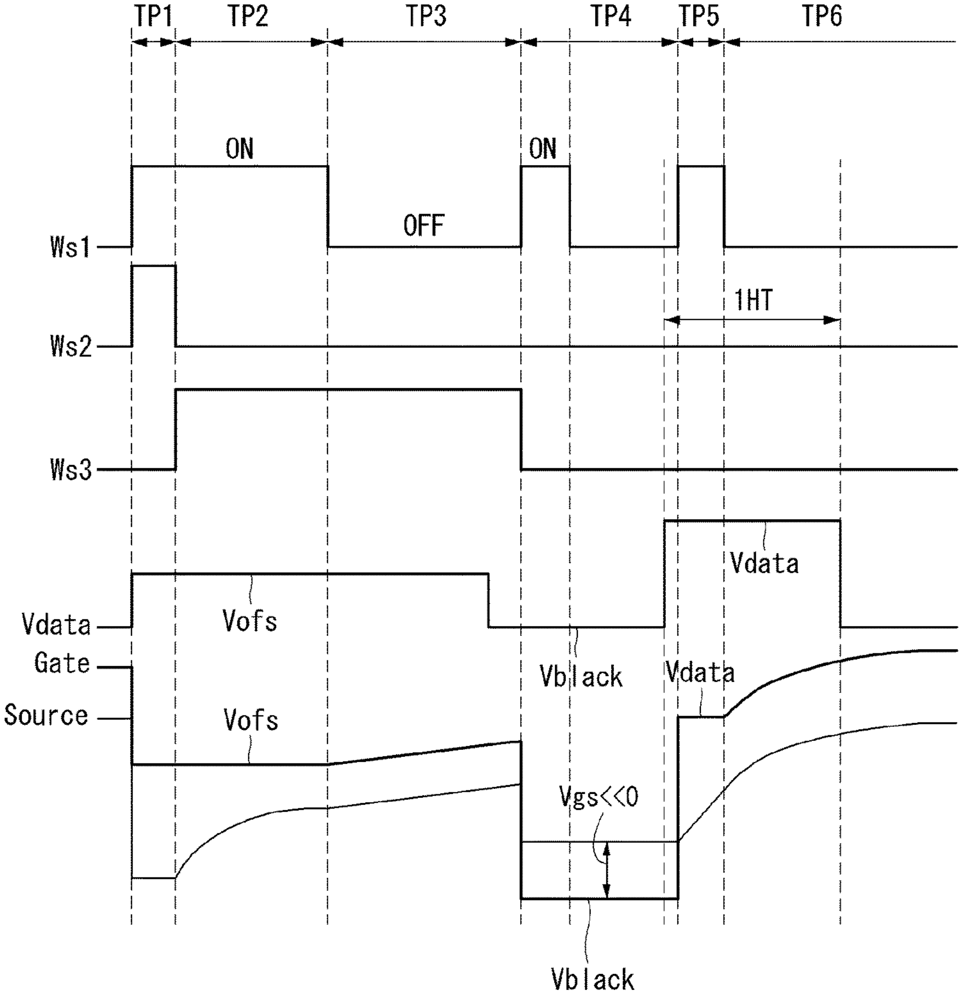
FIG. 19 is a second modification illustrating driving waveforms of a sub-pixel shown in FIG. 10 according to an embodiment.
Figure 20:
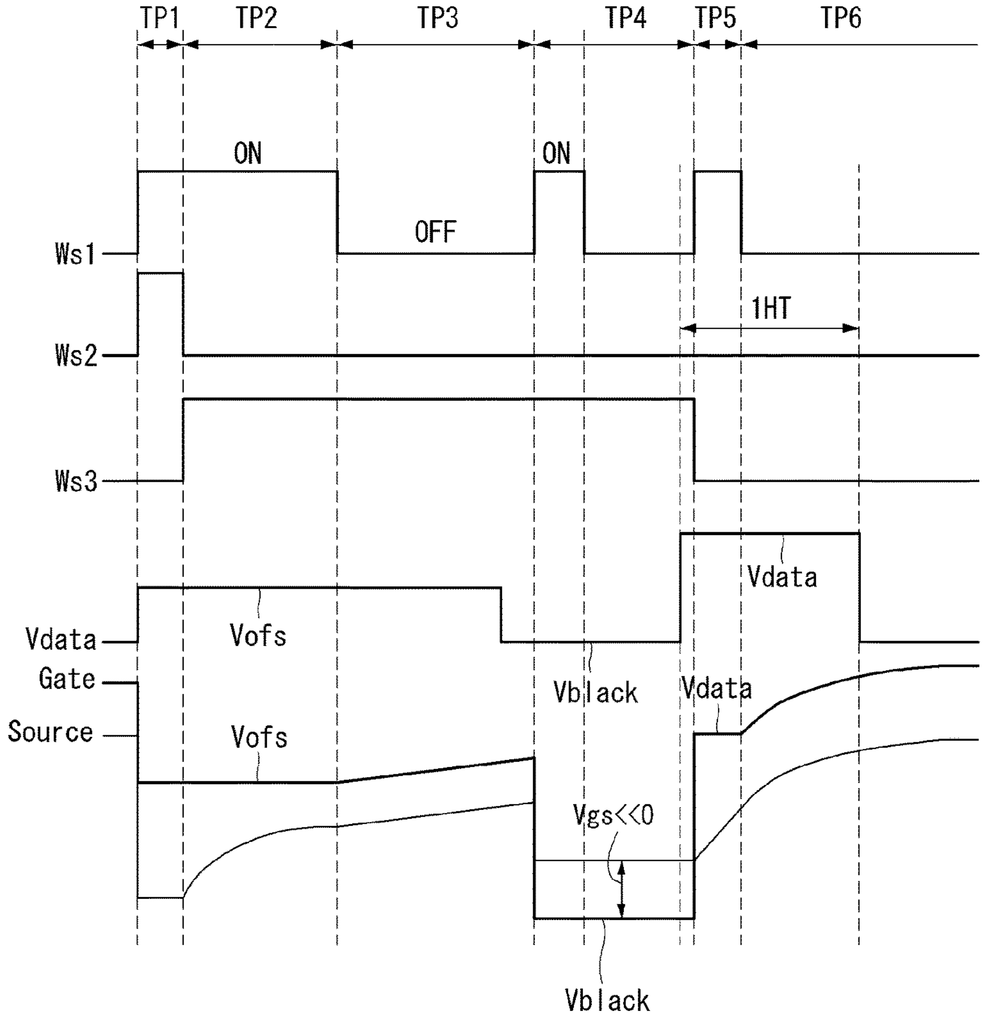
FIG. 20 is a third modification illustrating driving waveforms of a sub-pixel shown in FIG. 10 according to an embodiment.

FIG. 18 is a first modification illustrating driving waveforms of a sub-pixel shown in FIG. 10. FIG. 19 is a second modification illustrating driving waveforms of a sub-pixel shown in FIG. 10. FIG. 20 is a third modification illustrating driving waveforms of a sub-pixel shown in FIG. 10.

As shown in FIG. 18, the third switching transistor ST3 may be turned off only in the second threshold voltage compensation period TP3. As shown in FIG. 19, the third switching transistor ST3 may be turned off only in the first threshold voltage compensation period TP2 and the second threshold voltage compensation period TP3. As shown in FIG. 20, the third switching transistor ST3 may be turned off only in the first threshold voltage compensation period TP2, the second threshold voltage compensation period TP3, and the black data voltage writing period TP4.

The third switching transistor ST3 is turned off for a predetermined period to prevent a leakage current problem caused by a capacitor (OLED cap) component existing in the organic light emitting diode (OLED). Therefore, the turn-off period of the third switching transistor ST3 can be optimized in consideration of a capacitor (OLED cap) component present in the organic light emitting diode OLED and a driving method thereof, and thus is not limited to the above description.

As described above, the embodiment of the present disclosure sequentially compensates the threshold voltage and the electron mobility of the driving transistor in a unit of the display block, and compensates for the problem of varying electrical characteristics of the driving transistor. Thus, the embodiment of the present disclosure has an effect of improving lifetime and reliability of the device. In addition, the embodiment of the present disclosure provides a source-follower type internal compensation, and prevents the leakage current caused by the capacitor component existing in the organic light emitting diode during the driving period of each display block performed in the compensation. Thus, the embodiment of the present disclosure has an effect of preventing the problem of block dim on the display panel.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent display comprising:

a driving transistor configured to generate a driving current depending on a gate-source voltage;

a storage capacitor configured to store a data voltage and provide the stored data voltage to a gate electrode of the driving transistor;

a first switching transistor configured to control a gate potential of the driving transistor;

a second switching transistor configured to control a source potential of the driving transistor;

a light emitting diode configured to emit light in response to the driving current generated from the driving transistor; and a third switching transistor configured to electrically float a source electrode of the driving transistor and an anode electrode of the light emitting diode, wherein the electroluminescent display configured to perform the following steps:

an initialization step during a first time period in which the first switching transistor is turned on to supply an offset voltage from a data line to the gate electrode of the driving transistor, and the second switching transistor is turned on to apply an initialization voltage to the source electrode of the driving transistor;

a first threshold voltage compensation step of compensating a threshold voltage of the driving transistor during a second time period in which the first switching transistor is turned on to supply the offset voltage from the data line to the gate electrode of the driving transistor and the second switching transistor is turned off;

a second threshold voltage compensation step during a third time period in which the first switching transistor and the second switching transistor are turned off so that the threshold voltage of the driving transistor is stored in the storage capacitor;

a black data voltage writing step during a fourth time period in which the first switching transistor is turned on to write a black data voltage from the data line to the gate electrode of the driving transistor, and the second switching transistor is turned off;

a data voltage writing and electron mobility compensation step during a fifth time period in which the first switching transistor is turned on to write the data voltage from the data line to the gate electrode of the driving transistor, and the second switching transistor is turned off, the data voltage compensating an electron mobility of the driving transistor; and a light emission step during a sixth time period in which the first and second switching transistors are turned off and the third switching transistor is turned on to cause the light emitting diode to emit light based on the driving current generated from the driving transistor, wherein the third switching transistor is turned off during at least one of the first to fifth time periods to prevent current leakage of the light emitting diode.

2. The electroluminescent display of claim 1, wherein the third switching transistor electrically floats the source electrode of the driving transistor and the anode electrode of the light emitting diode.

3. The electroluminescent display of claim 1, wherein the anode electrode of the light emitting diode is connected to the source electrode of the driving transistor, and a cathode electrode of the light emitting diode is connected to a low potential driving voltage terminal, one end of the storage capacitor is connected to the gate electrode of the driving transistor, and another end of the storage capacitor is connected to the source electrode of the driving transistor, the gate electrode of the driving transistor is connected to the one end of the storage capacitor, a drain electrode of the driving transistor is connected to a high potential driving voltage terminal, and the source electrode of the driving transistor is connected to the other end of the storage capacitor, a gate electrode of the first switching transistor is connected to a first A scan line, a drain electrode of the first switching transistor is connected to a data line, a source electrode of the first switching transistor is connected to the gate electrode of the driving transistor, a gate electrode of the second switching transistor is connected to a first B scan line, a drain electrode of the second switching transistor is connected to the source electrode of the driving transistor, a source electrode of the second switching transistor is connected to a reference line, a gate electrode of the third switching transistor is connected to a first C scan line, a drain electrode of the third switching transistor is connected to the source electrode of the driving transistor, and a source electrode of the third switching transistor is connected to the anode electrode of the light emitting diode.

4. The electroluminescent display of claim 1, wherein a compensating operation including the first to sixth time periods are sequentially generated in units of display blocks of the display panel, wherein the compensation operation is non-overlapping between the display blocks of the display panel.

5. The electroluminescent display of claim 1, wherein the first and the second switching transistor are formed of N-Type transistors and the third switching transistor is formed of P-Type transistor.

6. The electroluminescent display of claim 1, when the black data voltage is applied, the gate-source voltage of the driving transistor becomes lower than the threshold voltage of the driving transistor.

7. A method of driving an electroluminescent display including a display panel in which sub-pixels which include a light emitting diode and a driving transistor, respectively to display an image and compensate a threshold voltage and an electron mobility of the driving transistor in compliance with a source-follower type internal compensation method are formed, and pixel lines are formed by the sub-pixels, a gate driver configured to drive scan signal lines formed on the display panel, and a data driver configured to drive data lines formed on the display panel, the method comprising:

controlling operation of the gate driver and the data driver, while compensating sequentially the threshold voltage and the electron mobility of the driving transistor in a unit of display block of the display panel, compensating simultaneously the threshold voltage of the driving transistor with respect to all the pixel lines belonging to a same display block, and then compensating sequentially the electron mobility of the driving transistor in a unit of pixel line in the same display block, wherein a source electrode of the driving transistor and an anode electrode of the light emitting diode are electrically floated during a period of compensating the threshold voltage and electron mobility of the driving transistor wherein the compensating sequentially steps further comprises:

an initialization step during a first time period in which a first switching transistor is turned on to supply an offset voltage from a data line to a gate electrode of the driving transistor, and a second switching transistor is turned on to apply an initialization voltage to the source electrode of the driving transistor;

a first threshold voltage compensation step of compensating a threshold voltage of the driving transistor during a second time period in which the first switching transistor is turned on to supply the offset voltage from the data line to the gate electrode of the driving transistor and the second switching transistor is turned off;

a second threshold voltage compensation step during a third time period in which the first switching transistor and the second switching transistor are turned off so that the threshold voltage of the driving transistor is stored in a storage capacitor;

a black data voltage writing step during a fourth time period in which the first switching transistor is turned on to write a black data voltage from the data line to the gate electrode of the driving transistor, and the second switching transistor is turned off;

a data voltage writing and electron mobility compensation step during a fifth time period in which the first switching transistor is turned on to write the data voltage from the data line to the gate electrode of the driving transistor, and the second switching transistor is turned off, the data voltage compensating an electron mobility of the driving transistor; and a light emission step during a sixth time period in which the first and second switching transistors are turned off and a third switching transistor is turned on to cause the light emitting diode to emit light based on a driving current generated from the driving transistor, wherein the third switching transistor is turned off during at least one of the first to fifth time periods to prevent current leakage of the light emitting diode, wherein the electroluminescent display includes the driving transistor configured to generate the driving current depending on a gate-source voltage, the storage capacitor configured to store the data voltage and provide the stored data voltage to the gate electrode of the driving transistor, the first switching transistor configured to control a gate potential of the driving transistor, the second switching transistor configured to control a source potential of the driving transistor, the light emitting diode configured to emit light in response to the driving current generated from the driving transistor, and the third switching transistor configured to electrically float the source electrode of the driving transistor and the anode electrode of the light emitting diode.

8. The method of claim 7, wherein compensating the display block includes a floating period existing between the second period in which the threshold voltage of the driving transistor is compensated and the fifth period in which the electron mobility of the driving transistor is compensated, and third transistors of all the pixel lines belonging to the same display block are turned off during the floating period.

9. A method of driving an electroluminescent display, comprising:

an initialization step during a first time period in which a first switching transistor is turned on to supply an offset voltage from a data line to a gate electrode of a driving transistor, and a second switching transistor is turned on to apply an initialization voltage to a source electrode of the driving transistor;

a first threshold voltage compensation step of compensating a threshold voltage of the driving transistor during a second time period in which the first switching transistor is turned on to supply an offset voltage from the data line to the gate electrode of the driving transistor and the second switching transistor is turned off;

a second threshold voltage compensation step during a third time period in which the first switching transistor and the second switching transistor are turned off so that the threshold voltage of the driving transistor is stored in a storage capacitor;

a black data voltage writing step during a fourth time period in which the first switching transistor is turned on to write a black data voltage from the data line to the gate electrode of the driving transistor, and the second switching transistor is turned off;

a data voltage writing and electron mobility compensation step during a fifth time period in which the first switching transistor is turned on to write the data voltage from the data line to the gate electrode of the driving transistor, and the second switching transistor is turned off, the data voltage compensating an electron mobility of the driving transistor; and a light emission step during a sixth time period in which the first and second switching transistors are turned off and a third switching transistor is turned on to cause a light emitting diode to emit light based on a driving current generated from the driving transistor, wherein the third switching transistor is turned off during at least one of the first to fifth time periods to prevent current leakage of the light emitting diode, wherein the electroluminescent display includes the driving transistor configured to generate the driving current depending on a gate-source voltage, the storage capacitor configured to store the data voltage and provide the stored data voltage to the gate electrode of the driving transistor, the first switching transistor configured to control a gate potential of the driving transistor, the second switching transistor configured to control a source potential of the driving transistor, the light emitting diode configured to emit light in response to the driving current generated from the driving transistor, and the third switching transistor configured to electrically float the source electrode of the driving transistor and an anode electrode of the light emitting diode.

10. The method of claim 9, further comprising: a current leakage prevention step of the light emitting diode existing between the first threshold voltage compensation step and the electron mobility compensation step.

11. The method of claim 10, wherein the current leakage prevention step of the light emitting diode electrically floats the source electrode of the driving transistor and the anode electrode of the light emitting diode.

12. The method of claim 11, wherein third transistors of sub-pixels belonging to at least one pixel line are all turned off during the current leakage prevention step of the light emitting diode.

13. The method of claim 11, wherein the current leakage prevention step of the light emitting diode is performed from the first threshold voltage compensation step to the electron mobility compensation step.

14. The method of claim 11, wherein the current leakage prevention step of the light emitting diode is performed by the third switching transistor.

* * * * *